United States Patent [19]

Liepins

[11] 4,390,567
[45] Jun. 28, 1983

[54] METHOD OF FORMING GRADED POLYMERIC COATINGS OR FILMS

[75] Inventor: Raimond Liepins, Los Alamos, N. Mex.

[73] Assignee: The United States of America as represented by the United States Department of Energy, Washington, D.C.

[21] Appl. No.: 242,807

[22] Filed: Mar. 11, 1981

[51] Int. Cl.³ .................... B05D 7/24; C23C 11/00
[52] U.S. Cl. ................................ 427/214; 376/151; 376/152; 376/916; 427/6; 427/215; 427/217; 427/221; 427/222; 427/250; 427/252; 427/255.6; 427/255.7
[58] Field of Search .............. 376/151, 152, 916; 427/250, 252, 38, 39, 6, 40, 41, 213, 214, 215, 217, 220, 221, 222, 255.6, 255.7

[56] References Cited

U.S. PATENT DOCUMENTS

| | | | |
|---|---|---|---|
| 2,984,575 | 5/1961 | Fitch | 106/1 |
| 3,163,665 | 12/1964 | Fitch | 260/430 |
| 3,914,472 | 10/1975 | Nakanishi et al. | 427/250 |
| 3,920,483 | 11/1975 | Johnson, Jr. et al. | 427/38 X |
| 3,994,822 | 11/1976 | De Bacci et al. | 427/6 X |
| 4,123,308 | 10/1978 | Nowlin et al. | 427/41 |
| 4,224,261 | 9/1980 | Halpern | 376/152 X |
| 4,290,847 | 9/1981 | Johnson et al. | 427/6 X |

*Primary Examiner*—Norman Morgenstern
*Assistant Examiner*—Thurman K. Page

[57] ABSTRACT

Very smooth polymeric coatings or films graded in atomic number and density can readily be formed by first preparing the coating or film from the desired monomeric material and then contacting it with a fluid containing a metal or a mixture of metals for a time sufficient for such metal or metals to sorb and diffuse into the coating or film. Metal resinate solutions are particularly advantageous for this purpose. A metallic coating can in turn be produced on the metal-loaded film or coating by exposing it to a low pressure plasma of air, oxygen, or nitrous oxide. The process permits a metallic coating to be formed on a heat sensitive substrate without the use of elevated temperatures.

14 Claims, No Drawings

METHOD OF FORMING GRADED POLYMERIC COATINGS OR FILMS

U.S. Government has rights in this invention pursuant to Contract W-7405-ENG-36 between the U.S. Department of Energy and the University of California (41 C.F.R. § 9—9.109-6(i)(5)(ii)(B)).

BACKGROUND OF THE INVENTION

The invention described herein relates to methods of forming graded polymeric coatings or films on a desired substrate and of forming metallic coatings on polymeric or other nonmetallic substrates. In particular, it relates to methods of forming such coatings or films by sorption and/or diffusion of metals into coatings or films of polymeric material deposited by conventional techniques on a desired substrate.

Metal coated articles enjoy a wide utility. Typically, such articles are obtained by chemical or electrolytic processes wherein a compound of the coating metal is reduced to the metal on a desired substrate under controlled conditions. In general, however, the known methods are not entirely satisfactory. They require either high temperatures (above 150° C. to as high as 1500° C.) or are limited to aqueous plating baths or the use of "active" metal substrates in accordance with the electromotive series and are otherwise not readily adapted to coating a wide variety of substrates, especially those of various plastics or other organic polymeric materials.

This latter defect in presently taught metal coating processes is particularly disadvantageous in certain specialized utilities as, for example, the fabrication of advanced (laser, electron beam, light ion, heavy ion) inertial confinement fusion (ICF) targets. Such targets are exemplified by the Los Alamos National Laboratory Polaris Prime design in which a glass microballoon containing the deuterium-tritium fuel mixture is encapsulated by four distinct layers or shells. The outermost layer is a relatively thick (75 $\mu$m), low atomic number, Z (1 to 9) plastic or polymeric shell that absorbs the laser light and provides the ablation atmosphere. This outer shell is deposited directly on an intermediate pusher layer which is a high-Z-loaded plastic or polymeric shell typically 75 $\mu$m thick that both shields the fuel from preheat and provides velocity multiplication when it collides with the high-Z metal, e.g., Au, inner pusher which is deposited directly on the microballoon. Between the intermediate pusher layer and the inner pusher layer is a low-Z cushion layer which, depending on the design, requires a density of 0.01 to 1 g/cm$^3$ or more and can be a gas, a small-cell plastic foam, or a normal-density plastic. In Polaris Prime this cushion is typically 280 $\mu$m thick. The fuel is a layer of DT ice almost 10 $\mu$m thick deposited on the inner wall of the 1 $\mu$m thick glass microballoon.

It is desirable to modulate the pressure profile during the implosion. This can be done by varying the effective atomic number Z as a function of radius in the absorber-/ablator layer. To produce the necessary variation, it is necessary to have techniques for forming this layer by depositing high-Z-loaded plastics or other polymeric materials having radial gradients both in Z and in density.

Finally, in order to avoid the development of hydrodynamic instabilities during the implosion, high-quality surface finishes having deviations less than 0.1% of the coating thicknesses and coating thicknesses uniform to at least 1% are required for amost all of the various plastic or polymeric coatings or films contemplated for use in an ICF target.

Although various techniques have been used in the manufacture of ICF targets, the most successful have been the low-pressure-plasma (LPP) coating process, also known as glow-discharge polymerization, plasma polymerization, etc., and the vapor-phase-pyrolysis (VPP) coating process. There is general agreement that the LPP process is extremely complex and critically dependent on the experimental conditions used. Nonetheless, the LPP process has the advantage over the VPP process in that it can coat free-standing microsphere substrates with high coating thicknes uniformity ($\sim$1%) and very smooth surface (a few 10-nm peak-to-valley irregularities). The VPP process, on the other hand, can produce very thick coatings (40 $\mu$m and higher) in a reasonably short time with no apparent thickness limitation, but is limited to stalk-mounted substrates for coating thicknesses above about 5 $\mu$m. Neither process, however, is entirely conducive to producing graded polymeric coatings or films having an appropriate loading of a desired metal or metals or to producing metal coatings on polymeric substrates.

Accordingly, an immediate object of this invention is to provide a method for the preparation of metal-loaded polymeric or plastic coatings or films of various concentration and density gradients needed in the fabrication of ICF targets.

A more general object of the invention is to provide a method for the generation of metal-loaded polymeric or plastic coatings or films useful in a variety of applications requiring films or coatings havig conductive properties.

Another object of the invention is to provide a method for preparing metallized (metal-coated) nonmetallic substrates.

Yet another object of the invention is to provide a method of forming very smooth surfaces on films or coatings deposited on substrates.

A further object of the invention is to provide a method of preparing metal coatings on heat sensitive substrates without damaging such substrates.

A still further object of the invention is to provide a method of obtaining mixed metal or alloy concentrations within or on polymeric or plastic coatings or films.

Additional objects, advantages and novel features of the invention will be set forth in part in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTION

In one broad aspect the invention encompasses a method of forming a graded polymeric coating on a desired substrate in which a polymeric coating is first formed on the substrate and then is contacted with a fluid containing a metal or mixture of metals for a time sufficient for such metal or metals to sorb and diffuse into the polymeric coating.

In another broad aspect the invention encompasses a method of forming a metallic coating on a polymeric substrate in which the polymeric substrate is contacted with a fluid containing a metal or mixture of metals for a time sufficient for such metal or metals to sorb or diffuse into the polymeric substrate and the metal-loaded substrate is then subjected to a low pressure plasma for a time sufficient to form the desired metallic coating on the substrate. Low pressure atmospheres of oxygen, air, or nitrous oxide are preferred for forming the plasma.

In still another broad aspect the invention encompasses a method of smoothing a polymeric coating or film in an inertial fusion target in which the target coating or film is briefly placed in uniform contact with a liquid bath or spray of a resin or resin solution.

Metal resinates and resinate solutions have been found particularly advantageous for use in the practice of the invention. A wide variety of metals from every period of the periodic table may be used. Particular advantages of the invention reside in the ability to produce very smooth polymeric coatings, both graded and nongraded, and in the ability to generate metallic coatings on heat-sensitive substrates without the necessity of using elevated temperatures.

DESCRIPTION OF THE PREFERRED EMBODIMENTS

Graded Z and density coatings, metal on polymeric coatings, and extremely smooth surfaces can be generated by a sorption/diffusion process in a wide variety of polymeric coatings and films. All that is required is that the metal be present in a suitable fluid form when contacted with the polymeric material and the polymeric material be such that sorption and/or diffusion can occur. Preferably the process involves the use of a solution of molecularly dispersed, readily available organometallic compounds or metal salts in a mixture of organic solvents with or without a dispersing (spraying) gas (propellant). If the object is to generate only smooth surfaces, without the introduction of a metal, then the solutions used do not require a metal compound. Thus, the process of the invention provides graded Z and density coatings without the necessity of using LLP or VPP techniques, but it can readily be used in conjunction with such techniques. Furthermore, it provides metallic coatings on polymeric coatings and films by a method that is not dependent on an aqueous plating bath, the activity of the metals in the electromotive series, metallization process involving high temperature (above 150° C.) either in the direct vaporization of the metal or the use of some energetic agent to vaporize the metal, chemical metallizing processes involving metal salt/phosphine complexes or metal secondary, cyclic, or tertiary mercaptides, or high temperature firing (decomposition) processes. Rather, for the production of metal coatings it depends only on the sorption/diffusion of the metal solution into the polymeric film or coating and subsequent exposure of the film or coating to a low pressure plasma generated, e.g., in air, oxygen, or nitrous oxide ($N_2O$) at or near room temperature. It should be noted that while metal salt/phosphine complexes are not required for use in the process of the invention neither are they precluded.

A fairly extensive literature on the principles of penetration of liquids into solids exists. See, e.g., Faraday Soc. Discussions 3, 5 (1948); and J. Crank, G. S. Park, eds., *Diffusion in Polymers* (Acadmeic Press, 1968). The basic factors that affect the transport of a permeant into a polymeric coating or film are: (1) the size, shape, and polarity of the permeant molecule, (2) the concentration of the permeant in the polymer, and (3) the nature of the polymeric coating or film, e.g., chain flexibility, crystallinity, polarity, free volume within the polymeric matrix, etc. In the final analysis, the penetration is controlled by the adhesion between the molecules, both self-cohesion within the permeant and that between the permeant and the material being permeated. Also, a very important factor that determines the speed at which large permeant molecules enter a polymeric matrix is the segmental motion of the polymer chains. The effect of the temperature on segmental motion is negligible below the glass transition temperature of the polymeric material but such motion increases dramatically above that temperature. Thus, the temperature at which the sorption/diffusion process is conducted can have a significant effect on the kinetics of metal loading of polymeric substrates.

The LPP process is old and well described in the literature. See, e.g., F. K. McTaggart, *Plasma Chemistry in Electrical Discharges* (Elsevier, 1967); J. L. Vossen, W. Kern, eds., *Thin Film Processes* (Academic Press, 1978); and M. Shen, A. T. Bell, eds., *Plasma Polymerization* (American Chemical Soc., Washington, D.C., 1979). The application of this process in the fabrication of ICF targets has been described (R. Liepins, M. Campbell, R. J. Fries, Progress in Polymer Science 6 (4), 169 (1980)). As has been noted earlier, there is a general agreement among the workers in the field that LPP processes are extremely complex and critically dependent on the experimental conditions used. This is partly because of the many different chemical species (free radicals, cations, anions, excited species, and neutrals) of a great variety of energies that are generated in a typical plasma. The knowledge of all the processes occurring in a plasma, and their rates, is simply not yet in hand. Accordingly, it will be understood that the present invention is not to be construed as dependent on any particular possible reaction mechanism but instead that a preferred embodiment is predicated on exposing sorption/diffusion treated substrates at or near room temperature to a plasma generated in air, oxygen, or $N_2O$ which causes their surfaces to be converted into a metallic coating.

In the particular embodiments contemplated for use as ICF targets, glass microballoons are coated with a hydrocarbon (aliphatic and/or aromatic) or perfluorocarbon polymeric coating by any of a variety of methods, e.g., LPP, VPP, physical vapor deposition, solution coating, etc., and this coating is subjected to the sorption/diffusion process of the invention. An important characteristic of a monomer suitable for use in LPP deposition of coatings is an electron-impact ionization potential. In general, those monomers having the lowest ionization potential produce the highest active species concentration in the plasma and thereby permit the deposition of thicker coatings at more rapid coating rates. It will be understood that in addition to having a reasonably low ionization potential, a preferred monomer must also be gaseous at the conditions present in the coating chamber. A particularly advantageous monomer for use in LPP coating has been found to be cyclooctatetraene which has an ionization potential of 7.99 eV.

In carrying out the sorption/diffusion process, the metal-containing solutions to be sorbed and diffused into the polymeric coating may be applied by dipping, spraying, spinning, brushing, stippling, stamping, or printing. The application process can be conducted at room temperature or at some higher temperature. The polymer-coated microballoons may be sorption/diffusion treated in a mounted configuration, e.g., on a glass stalk, or free standing. When microballoons are coated free standing they may be levitated in a gas stream or may be contained in a small container capped with a screen lid. In the latter case, they are agitated while exposed to the metal-containing solution or spray. The sorption/diffusion process can be conducted with not only metal solutions but also metal compounds that are gases at standard temperature and pressure conditions. When the process is performed with gaseous compounds, the use of a pressure vessel so that higher than atmospheric pressures can be used is preferable but not necessary.

The metals of most interest in a specified ICF target fabrication effort are those from the sixth period of the periodic table, e.g., Ta, W, Re, Os, Ir, Pt, Au, Hg, Pb, and Bi; however, the process is not limited to any one particular group of the elements in the periodic table. Thus, for example, using the process of the invention, elements from every period in the periodic table have been incorporated into polymeric coatings. The metal component may be an organometallic compound or an inorganic compound. The process of the invention may readily be practiced with metal-containing compositions or solutions as complex as those described and taught in U.S. Pat. Nos. 3,163,665 and 2,984,575 assigned to Englehard Industries, Inc., of Newark, N.J. or as simple as the compound $WF_6$ which is a gas at room temperature. The disclosures of U.S. Pat. Nos. 3,163,665 and 2,984,575 are hereby incorporated by reference for all that they teach.

The gold mercaptides disclosed and taught in U.S. Pat. Nos. 2,984,575 and 3,163,665 are representative of a large class of metal resinates commercially available from Engelhard Industries, Inc. A metal resinate is the reaction product of any of several organic compounds with a metal salt. The resulting compound is essentially a long chain organic molecule in which one site is occupied by one of a wide variety of metals. Metal resinates may range from highly fluid to very viscous liquids or may be solids. More importantly for the purposes of the present invention, they may be readily placed in solution using such organic solvents as toluol, chloroform, benzyl acetate, or methylene chloride. They thus provide high purity metals in organic solution form which are highly suitable for use in the practice of the invention. Metal resinate solutions of Au, Rh, Pt, Pd, Ir, Ru, Ag, Sb, Ba, Bi, B, Cd, Ce, Cr, Co, Cu, In, Fe, Pb, Mg, Mn, Mo, Ni, Nb, P, Si, Ta, Sn, Ti, W, V, Zn, and Zr are routinely commercially available from Engelhard Industries. Various other metal resinates may be obtained by special order.

Of the various methods of application of the metal-containing permeants to the microballoons, dipping or spraying in liquid solution or exposure to the gaseous atmosphere of the metal compound are the most convenient. Dipping consists of taking a mounted microballoon and submerging it into the metal-containing solution for a desired period of time, e.g., as short as 1 second or as long as 12 days. Dipping is most conveniently done in solutions at room temperature but may be done at some higher temperature. After dipping, the microballoon is dried in a dust free box at room temperature for several hours and then transferred to a vacuum oven and further dried at 50° C. for several hours. Depending on the coating thickness or concentration gradient desired, the polymeric coated microballoons may be conditioned in an appropriate organic liquid at or somewhat above room temperature prior to the sorption/diffusion treatment.

Alternatively, spraying or exposure to a gaseous atmosphere of the metal-containing permeant are most convenient if only a limited penetration of the metal compound into the polymeric coating is desired or a surface coating or surface smoothing only are desired. The spraying times are typically of one to several seconds duration and the exposure to a gaseous metal compound atmosphere may last for several hours or more if done at or near atmospheric pressure and at room temperature.

The following examples are representative of the manner in which graded Z and density coatings, metal on polymeric coatings, and super-smooth surface coatings may be produced in accordance with the invention. It is to be understood that these examples are intended merely to be representative of the manner in which the invention may be practiced and are not to be construed in any way as limiting the invention to the specific details set forth therein.

EXAMPLE 1

Glass microballoons (T2R-86; 350-400 $\mu$m diameter), mounted on glass stalks with Aramid fiber tips, were coated with 28 $\mu$m of polycyclooctatetraene in an LPP system. They were then placed in p-xylene at room temperature for 48 hours and immediately after this conditioning were dipped for 15 minutes in a gold resinate solution sold under the tradename of "Bright Gold No. 261" by Engelhard Industries, Inc. Following the dipping step, the coated microballoons were placed in a clean plastic box and allowed to dry at room temperature for about two hours and were then dried in a vacuum oven at 50° C. for 16 hours. The resultant gold concentration gradient in the coating was established by x-ray contact microradiography and the total gold concentration in the coating by neutron activation analysis. The gold had penetrated the coating to a depth of 5-6 $\mu$m in a decreasing concentration gradient and the gold concentration was 11% by weight of the coating.

EXAMPLE 2

Glass microballoons (T2R-86; 350-400 $\mu$m diameter) were LPP coated with 47 $\mu$m of polycyclooctatetraene and then placed in a small plexiglass tubing ($\sim$2 cm long, 1 cm diameter) capped with stainless steel screen caps. This assembly was submerged for 12 days at room temperature in a gold resinate solution sold under the tradename of "Bright Gold NW" by Engelhard Industries, Inc. The rest of the procedure was the same as that of Example 1. The coating was found to contain 73.5 wt. % of gold.

EXAMPLE 3

Glass microballoons were coated and treated as in Example 1 except that a platinum resinate solution sold under the tradename of "Bright Platinum 05X" by Engelhard Industries, Inc. was used. The coating was found to contain 9 wt. % of platinum.

EXAMPLE 4

Glass microballoons were coated and treated as in Example 1 except that a palladium chloride saturated acetone solution was used. The coating was found to contain 8 wt. % of palladium.

EXAMPLE 5

Glass microballoons were coated as in Example 1 and placed in a capped 20 ml flask in the presence of 1 ml of tungsten hexafluoride. At room temperature the liquid $WF_6$ passed into the gaseous phase and the coated microballoons were kept in the resultant $WF_6$ atmosphere for 24 hours. The coating was found to contain 16 wt. % of tungsten.

EXAMPLE 6

This example is representative of the preparation of graded Z and graded density coatings using mixed metals. Glass microballoons were LPP coated with a monomer mixture of tetramethyl lead and cyclooctatetraene to a coating thickness of 55–60 μm. Since determination of lead by neutron activation analysis requires a very high neutron flux, the lead content of the resultant coating was estimated by atomic absorption analysis of the LPP film deposited on the electrodes in the coating chamber. A dipping solution was prepared by combining equal weights of Engelhard "Bright Gold No. 261" and "Bright Platinum 05X." The coated microballoons were kept in the mixed solution for 30 seconds. The rest of the procedure was as given in Example 1. The coating contained the following amounts of the metals: lead 49.6 wt. %, gold 10.7 wt. %, and platinum 10.7 wt. %.

Practice of the invention has not been limited to either the coatings or the metals set forth in Examples 1–6. Thus, other elements that have been incorporated by one or another of the procedures described in Examples 1–6 are silver, tantalum, iridium, boron, bromine, iodine, and osmium. In addition, the process of the invention has been practiced using coatings of poly(p-xylene), poly(p-xylylene), ammonia-borane, poly(perfluorobutyne-2), and poly(perfluorobutene-2). Finally, other mixed element combinations that have been incorporated into the coatings include Pb-Au, Pb-Pt, Pb-Pd, B-Au, B-Pt, B-Pd, Au-Bi, Au-Tl, Au-Pt, Au-Pd, Pt-Pd, Pb-Au-Pd, and Pb-Pt-Pd.

EXAMPLE 7

This example is representative of the generation of a metal coating on a polymeric coating. Sorption/diffusion treated microballoons as described in Examples 1–6 were placed in an LPP chamber between flat plate aluminum electrodes and a plasma generated using the following typical experimental parameters:

| | |
|---|---|
| Plasma Gas: | 400 mtorr oxygen |
| Current: | 8.0 mA |
| Time: | 4 hours |
| Temperature: | Room temperature |

At the end of this treatment time, the surface of the initially black color of gold containing coatings had been converted into a bright gold colored one, while platinum containing coatings changed from dark brown to silver. Generation of a metallic coating on a polymeric coating was also evidenced by the fact that during scanning electron microscopy of such coatings a lack of surface charging indicated that they were conductive (as a metallic coating should be). Polymeric coatings without a surface metal layer undergo a serious surface charging, thus preventing scanning electron microscopy of the nonmetallized surface. In addition, X-ray photoemission spectroscopy of a surface layer (about 20 μm deep) of an organo-gold-coated polymeric substrate showed that the surface layer gold concentration increased with increasing LPP treatment time, indicative of the formation of a pure gold coating on the surface of the polymeric substrate coating.

It is important to note that the process set forth in Example 7 permits metal coatings to be generated at essentially room temperature using metal compounds that heretofore in the art had been taught as requiring elevated temperatures to be reduced to the metal. Thus, for example, although as previously noted, a wide variety of metal resinates are commercially available from Engelhard Industries, Inc., there has been no previous indication that such resinates can be used to produce metal films or coatings without the necessity of using high temperatures.

It will readily be seen that because no elevated temperatures are required to produce a desired metallic coating, this process of generating metallic coatings can be used on heat sensitive substrates which heretofore had not been amenable to coating with metals and certainly not with any of the metallic solutions or compounds taught as feed stocks for use with the process of the present invention. Thus, for example, glass microballoons filled with a deuterium-tritium mixture to a high pressure may be coated with desired metals by this process. Prior art processes requiring the use of elevated temperatures could not be used for this purpose because the high temperature necessary to achieve the metallic coating also results in diffusion of the tritium and deuterium out of the microballoon.

EXAMPLE 8

This example is representative of the generation of super-smooth surfaces by the process of the invention. Unless special care is taken and special experimental procedures followed, typical coating surfaces of various polymers deposited by any of the techniques previously indicated may be as rough as several microns measured from peak to valley. Such surface roughness may be an order of magnitude higher than is permissible by ICF target coating standards. It has been found that sorption/diffusion treatment with gold, platinum, and silver resinate solutions from Engelhard Industries, Inc. by the dipping technique lead naturally to surface smoothing of the substrate. Surfaces as smooth as 30–40 nm are obtained. Equivalent surface smoothing may also be achieved with certain readily available resins which do not contain any metals, e.g., clear gloss lacquer, a polyurethane varnish, an acrylic solution, and an epoxy ester solution. The most convenient application of these solutions for surface smoothing is by spraying although dipping gives equally good results. If spraying is preferred, a 1–2 second exposure to the spray is sufficient to generate the smooth surface in a polymeric coating on microballoons. Drying of the coating is done in a clean plastic box at room temperature for several hours.

The foregoing description of preferred embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use of the invention as set forth herein. This description sets forth the best mode presently contemplated for the practice of the invention. Finally, it is intended that the scope of the invention be defined by the claims appended hereto.

What is claimed is:

1. A method of forming a graded metal-bearing polymeric coating on a desired substrate which comprises (a) forming on said substrate a polymeric coating susceptible to permeation by a metal, and (b) contacting said polymeric coating with a fluid containing a metal compound or mixture of metal compounds at a temperature below 150° C. for a time sufficient for such metal compound or metal compounds to sorb and diffuse into said polymeric coating.

2. The method of claim 1 wherein said fluid is a solution of one or more metal resinates.

3. The method of claim 1 or claim 2 wherein said metal compound or mixture of metal compounds comprises a metal selected from the group consisting of Au, Rh, Pt, Pd, Ir, Ru, Ag, Sb, Ba, Bi, B, Cd, Ce, Cr, Co, Cu, In, Fe, Pb, Mg, Mn, Mo, Ni, Nb, Ta, Sn, W, Ti, V, Zn, Zr, or a mixture thereof.

4. The method of claim 3 wherein said metal is Au or Pt.

5. The method of claim 1 wherein said fluid is a vapor of a metallic compound or compounds.

6. The method of claim 1 or claim 2 wherein said polymeric coating is an aliphatic or aromatic hydrocarbon coating or a perfluorocarbon coating.

7. The method of claim 6 wherein said coating is polycyclooctatetraene.

8. A method forming a graded metal-bearing polymeric coating on a glass microballoon which comprises (a) forming on said microballoon a polymeric coating susceptible to permeation by a metal, and (b) contacting said polymeric coating with a fluid containing a metal compound or mixture of metal compounds at a temperature below 150° C. for a time sufficient for said metal compound or metal compounds to sorb and diffuse into said polymeric coating.

9. The method of claim 8 wherein said fluid is a solution of one or more metal resinates.

10. The method of claim 8 wherein said metal compound or mixture of metal compounds comprises a metal selected from the group consisting of Au, Rh, Pt, Pd, Ir, Ru, Ag, Sb, Ba, Bi, B, Cd, Ce, Cr, Co, Cu, In, Fe, Pb, Mg, Mn, Mo, Ni, Nb, Ta, Sn, W, Ti, V, Zn, Zr, or a mixture thereof.

11. The method of claim 10 wherein said metal is Au or Pt.

12. The method of claim 8 wherein said fluid is a vapor of a metallic compound or compounds.

13. The method of claim 8 wherein said polymeric coating is an aliphatic or aromatic hydrocarbon coating or a perfluorocarbon coating.

14. The method of claim 13 wherein said coating is polycyclooctatetraene.

* * * * *